United States Patent [19]
Kadomura

[11] Patent Number: 5,281,304
[45] Date of Patent: Jan. 25, 1994

[54] PROCESS FOR FORMING COPPER WIRING

[75] Inventor: Shingo Kadomura, Kanagawa, Japan

[73] Assignee: Sony Corporation, Tokyo, Japan

[21] Appl. No.: 891,220

[22] Filed: May 29, 1992

[30] Foreign Application Priority Data

May 31, 1991 [JP] Japan ................... 3-129150

[51] Int. Cl.$^5$ .................... B44C 1/22; C23F 1/00; H01L 21/00
[52] U.S. Cl. .................... 156/656; 156/657; 156/666
[58] Field of Search ............ 156/656, 657, 666

[56] References Cited

U.S. PATENT DOCUMENTS 4,466,859  8/1984  Nelson ........................... 156/666
4,913,769  4/1990  Kanda et al. ................... 156/666

FOREIGN PATENT DOCUMENTS 3144592  6/1988  Japan ............................. 156/656

Primary Examiner—Carl F. Dees
Attorney, Agent, or Firm—Hill, Steadman & Simpson

[57] ABSTRACT

A process for forming a copper wiring is composed of modifying a surface of a copper film to copper sulfide, forming the wiring pattern by etching to define a desired design of the wiring, reducing copper sulfide film to copper, and applying an insulation film to the surroundings of the wiring pattern of copper. Successively forming of the wiring is done by processing in a multi-chamber equipment having functions of the above.

15 Claims, 2 Drawing Sheets

PROCESS FOR FORMING COPPER WIRING

BACKGROUND OF THE INVENTION

1. Field of The Invention

The present invention relates generally to a process for forming a copper wiring. Specifically, the present invention relates to a process for protecting a copper wiring formed on a semiconductor device from oxidation while forming.

2. Description of The Background Art

Recently, a wiring formed on a semiconductor device becomes minimized according to high integration of Ultra Large Scale Integrated Circuits (ULSI). Materials selected from aluminum and aluminum alloy has been widely utilized for such wiring. However, durability of such wiring against electromigration decreases according to minimization of interwiring distance. This causes deterioration of the device reliability. Additionally, aspect ratio of the wiring is increased when utilizing aluminum. This causes processing difficulty thereafter, such as forming an insulating film and flattening the wiring. In order to reduce aspect ratio of the wiring, metals having high melting point, such as molybdenum (Mo) and tungsten (W), are utilized. However, resistance of such metals becomes over 2 times of that of aluminum, especially, becomes higher when the wiring is formed of a very thinned layer. Therefore, materials which have sufficient durability against electromigration and low resistance have been required.

Copper (Cu) has about 1.4 $\mu\Omega$ cm of resistivity lower than that of aluminum which is about 2.8 $\mu\Omega$ cm. Therefore, a copper wiring can be formed of a thinner film allowing aspect ratio thereof to be reduced. Moreover, the copper wiring has sufficient durability against electromigration because of its low resistivity. Thus, such wiring may be provided with a micro device.

However, there are some problems when using copper for a wiring. First, copper will easily suffer from oxidation in an atmosphere including minimum percentage of oxygen at a temperature of about 200° C. Additionally, wiring surfaces are altered to copper oxide during the steps of resist ashing or washing. Secondly, an oxide film formed on the copper surface does not become sufficiently chemically stabilized. Therefore, oxygen molecules are dispersed in the copper film when contacting with the wiring surface, then copper in the interior of the film is altered to copper oxide which permits a rapid increase of electrical resistant thereof. Thus, copper becomes impracticable as a material for a wiring.

In order to solve the aforementioned problems, Japanese Patent First Publication (not allowed) No. 63-299250 discloses a process for forming an anti-oxidized copper wiring by depositing silicon on a surface of a copper wiring. Silicon is deposited by sputtering on a film of silicon dioxide ($SiO_2$) on which the copper wiring is laid. Then, heat treatment of the film is accomplished at temperatures of 800° to 1000° C. to form $Cu-SiO_2$ alloy on the surface thereof. Thus, a layer of alloy protects the copper from oxidation.

Alternatively, Japanese Patent First Publication (not allowed) No. 63-156341 discloses a process for forming a barrier layer on the surroundings of a copper wiring to protect copper from contacting with oxygen. An oxidation barrier formed of a film of titanium nitride (TiN) is applied to the surroundings of the copper wiring using bias sputtering.

However, both are processes for protecting a copper wiring from oxidation after finishing the wiring patternizing. Therefore, surface oxidation of a copper film meanwhile, such as ashing and washing, cannot be prevented.

Japanese Patent First Publication (not allowed) No. 2-125447 discloses a process for forming an anti-oxidation film having electrical conductivity on a surface of a copper film to protect the surface thereof from oxidation. The copper film is subjected to vapor or liquid including aromatic amines, such as benzotriazole, the anti-oxidation film having several molecules of thickness is laid on the copper film. Then, a wiring pattern is formed on the copper film via the anti-oxidation film. Patternization of a copper wiring is done by etching the wiring pattern. Then, after removing the surroundings, exposed surfaces of the copper wiring to ambient atmosphere are subjected to the vapor for the second time, similarly to the previously mentioned, vapor to coat residual surroundings of the copper wiring with the anti-oxidation film.

However, applying anti-oxidation film on the copper film must be done twice, i.e., before and after patternizing the copper wiring to provide sufficient protection thereof. This complicates manufacturing process. Furthermore, coating on the surroundings of the wiring decreases reliability thereof.

SUMMARY OF THE INVENTION

It is therefore a principal object of the present invention to provide a process for protecting a copper wiring formed on a semiconductor device from oxidation.

It is additional object of the present invention to provide a process for protecting a copper wiring from oxidation while forming.

It is a further object of the present invention to provide a process for forming a copper wiring protected from oxidation and having high reliability.

In order to accomplish the aforementioned and other objects, the present invention comprises the steps of modifying a surface of a copper film to a copper compound having characteristics of oxidation inhibitable by inducing chemical reaction, etching the film on which the copper compound is laid to patternize a wiring, reducing the patternized copper compound to copper, and insulating the copper film by applying an insulation film to the surroundings thereof. Copper sulfide is preferable for the copper compound.

The modifying step may include supplying ammonium hydrogensulfide to the copper film under vacuumed condition with heating at a temperature of 200° C. Alternatively, it may include supplying a mixture gas containing hydrogen and hydrogen sulfide to the copper film under ordinary pressure, balanced to that of ambient atmosphere, with heating at a temperature of 200° C. Preferably, the contained ratio of the hydrogen to the hydrogen sulfide is adjusted to 1:1.

The reducing step may include subjecting the copper film on which the copper sulfide is laid to an atmosphere containing ammonia gas with heating at a temperature of 250° C. Alternatively, it may include subjecting the copper film on which the copper sulfide is laid to a mixture containing ammonium hydroxide and hydrogen peroxide, and boiling the film at a temperature of 80° C. Preferably, the contained ratio of ammonium hydroxide to hydrogen peroxide is adjusted in a range from 2:1 to 2.95:0.05.

The steps of modifying, etching, reducing and insulating can be successively accomplished in a multichamber equipment.

In order to accomplish the process of the aforementioned, an apparatus for forming a copper wiring is composed of means for depositing a copper film on a substrate, a first reaction chamber for chemically modifying a surface of a copper film to copper sulfide, a second reaction chamber for reducing copper sulfide to copper, and means for insulating the copper film.

The first reaction chamber may include means for supplying ammonium hydrosulfide gas to the copper film and means for heating the copper film at a temperature of 200° C. The second reaction chamber may include means for supplying ammonia gas to the copper film on which copper sulfide is laid and means for heating the copper film at a temperature of 250° C.

The apparatus can be successively activated to function as a multichamber equipment.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENT

Figure 1:
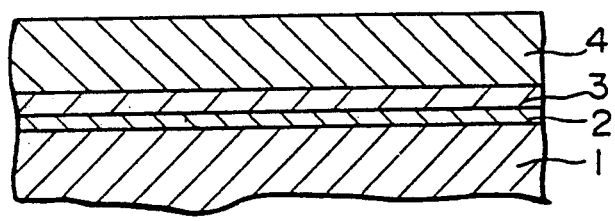
FIGS. 1 to 7 are cross-sectional views of a preferred embodiment of the present invention including a copper wiring which are provided to show the process of the present invention.
Figure 2:
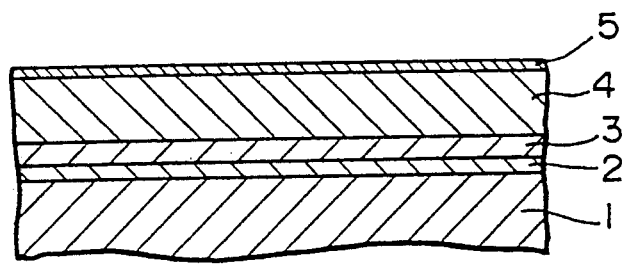

Referring now to the drawings, particularly to FIG. 1, a first insulation film 1 formed of an appropriate material, such as $SiO_2$, is laid on a silicon substrate (not shown in the figure). Then, a contact hole (not shown in the figure) is opened at a desired position of the first insulation film 1. A titanium (Ti) film 2, as a contact metal, is deposited thereon using DC magnetron sputtering to a thickness of about 250 angstrom. Next, a TiN film 3, as a barrier metal, is laid on the Ti film 2, preferably, to a thickness of about 1000 angstrom. A copper (Cu) film 4, is deposited thereon by DC magnetron sputtering to a thickness of about 5000 angstrom.

Then, the substrate on which the copper film 4 is deposited according to the process of the abovementioned is placed on a stage which is heated to a temperature of 200° C. under vacuumed condition. Next, ammonium hydrogensulfide ($NH_4SH$) gas is supplied to the stage to modify the surface of the Cu film 4 to a copper sulfide (CuS) hàving a crystal structure identical with azurite. Thus, a CuS film 5 having about less than 100 angstrom of thickness is formed on the Cu film 4. Alternatively, for modifying Cu to CuS, subjecting the surface of the Cu film to a mixture gas containing hydrogen ($H_2$) and hydrogen sulfide ($H_2S$) is available. The contained ratio of $H_2$ to $H_2S$ is adjusted to 1:1, and modification is accomplished under 200° C. at ordinary pressure (balanced to that of the surroundings of the equipment).

Figure 3:
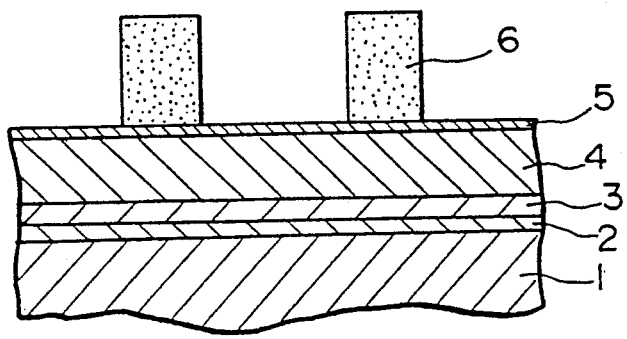
Figure 4:
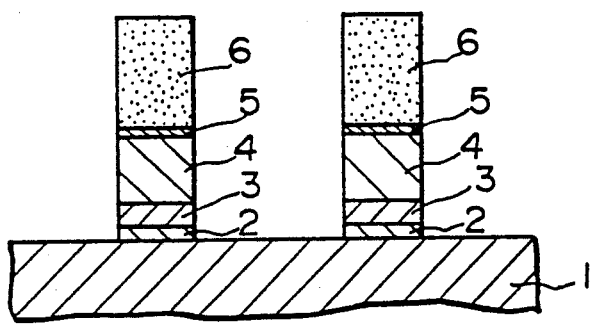

Referring now to FIG. 3, a resist pattern 6 is formed on a desired position of the surface of the CuS film 5 by appropriate lithography technique. The design of the resist pattern 6 is designed so as to define a wiring to be obtained. Then, as shown in FIG. 4, the laminated layer sequentially including the Ti film 2, the TiN film 3, the Cu film 4, and the CuS film 5 is patternized to the wiring by reactive ion etching (RIE). RIE may be accomplished under following conditions utilizing a magnetron type RIE equipment.

| RIE condition | |
|---|---|
| Etching Gas and Flow Rate | |
| Silicon tetrachloride ($SiCl_4$) | 20 SCCM |
| Nitrogen | 20 SCCM |
| Pressure | 30 mTorr |
| Output | 1 KW |
| Substrate Temperature | 250° C. |

Figure 5:
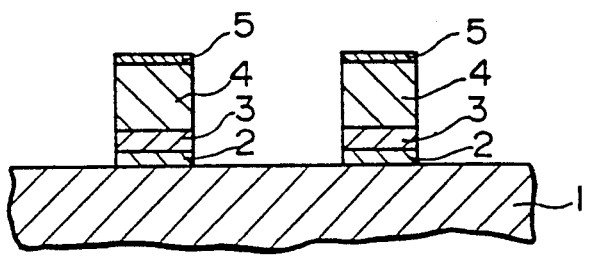

Referring to FIG. 5, the resist pattern 6 is removed after patternization as the aforementioned by ashing and washing to define the wiring on the laminated layer. Because the resist pattern 6 is designed on the CuS film 5 and not directly on the Cu film 4, the Cu film 4 is no longer exposed to oxygen present in ambient air during removal of the resist pattern 6. Thus, oxidation of the Cu film 4 is prevented meanwhile.

Figure 6:
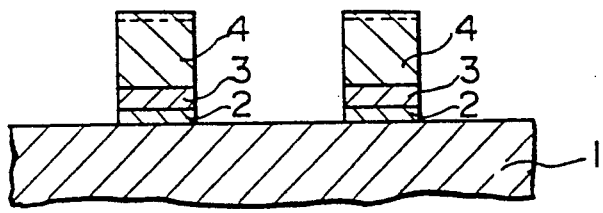

Referring next to FIG. 6, CuS is reduced to Cu. Rapid reduction is accomplished by supplying ammonia ($NH_3$) gas to the substrate with the laminated layer under heating condition at the temperature of 250° C. Alternatively, CuS can be reduced to Cu by boiling the substrate (with the laminated layer) in a mixture containing ammonium hydroxide and hydrogen peroxide ($NH_4OH/H_2O_2$) at a temperature of 80° C. The preferred contained ratio of ammonium hydroxide to hydrogen peroxide is in a range from 2:1 to 2.95:0.05.

Figure 7:
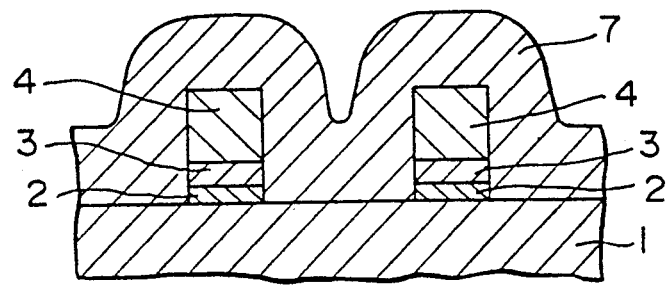

Referring now to FIG. 7, a second insulation film 7 formed of an appropriate material, such as $SiO_2$, is deposited on the CuS reduced surface of the Cu film by appropriate techniques, for example, chemical vapor deposition (CVD), to establish a layer of insulation. Then, the wiring formed of Cu is coated with the second insulation film. Thus, forming of the wiring is finished. The second insulation film 7 is formed by depositing plasma $SiO_2$ on the Cu film under the following conditions utilizing an appropriate equipment such as a plasma CVD equipment.

| CVD Conditions | |
|---|---|
| $TEOS/O_2$ | 350/350 SCCM |
| RF Device Output | 350 W |
| Pressure | 10 Torr |
| Interelectrode Distance | 180 mils |

As a preferred insulation film, various kinds of films, such as a SOG film, can be used instead of the $SiO_2$ film.

Forming the wiring of the present invention can be conveniently accomplished in a multichamber equipment including a sputtering system and/or a CVD system for forming the laminated films of Ti, TiN and Cu, and a reaction chamber for supplying $NH_4SH$ gas thereto with heating for forming the CuS film. When utilizing the multichamber equipment, oxidation of the surface of the Cu film after exposing the substrate to ambient atmosphere can be prevented. Thus, forming of the wiring can be rapidly accomplished with reliability. It is more preferred to equip a heating stage and a $NH_3$ supply system with a system for forming the insulation film. Then, copper sulfide can be reduced more rapidly, and applying the insulation film to the surroundings thereof can be successively accomplished.

According to the present invention, the copper surface can be protected from oxygen contact by the CuS film formed thereon during the processing, especially, during ashing and washing of the laminated films. Therefore, forming the wiring having high reliability can be accomplished.

Further to say, the copper film surface is modified to copper sulfide and reduced to copper again, therefore, final thickness of the copper film becomes similar to that of initially deposited. Accordingly, dimensional accuracy can be improved.

While the present invention has been disclosed in terms of the preferred embodiment in order to facilitate better understanding of the invention, it should be appreciated that the invention can be embodied in various ways without depending from the principle of the invention. Therefore, the invention should be understood to include all possible embodiments and modification to the shown embodiments which can be embodied without departing from the principle of the inventions as set forth in the appended claims.

What is claimed is:

1. A process for forming a copper wiring comprising the steps of:
    modifying a surface of a copper film by a chemical reaction to form a copper compound having characteristics of inhibiting oxidation,
    etching said film and said copper compound to patternize a wiring,
    reducing said patternized copper compound to copper, and
    insulating said copper film by applying an insulation film to the surroundings thereof.

2. A process as set forth in claim 1, wherein said copper compound is copper sulfide.

3. A process as set forth in claim 1, wherein said modifying step includes supplying ammonium hydrogensulfide to said copper film under vacuum condition with heating at a temperature of 200° C.

4. A process as set forth in claim 1, wherein said modifying step includes supplying a gas mixture containing hydrogen and hydrogen sulfide to said copper film under ordinary pressure balanced to that of ambient atmosphere with heating at a temperature of 200° C.

5. A process as set forth in claim 4, wherein the contained ratio of said hydrogen to said hydrogen sulfide is adjusted to 1:1.

6. A process as set forth in claim 1, wherein said reducing step includes subjecting said copper film on which said copper sulfide is laid to an atmosphere containing ammonia gas with heating at a temperature of 250° C.

7. A process as set forth in claim 1, wherein said reducing step includes subjecting said copper film on which said copper sulfide is laid to a mixture containing ammonium hydroxide and hydrogen peroxide, and boiling said film at a temperature of 80° C.

8. A process as set forth in claim 7, wherein the contained ratio of said ammonium hydroxide to said hydrogen peroxide is adjusted in a range from 2:1 to 2.95:0.05.

9. A process for forming a copper wiring comprising the steps of:
    modifying a surface of a copper film to copper sulfide to inhibit oxygen contact with said copper film,
    etching said film on which said copper sulfide is laid to patternize a wiring,
    reducing said patternized copper sulfide to copper, and
    insulating said copper film by applying an insulation film to the surroundings thereof.

10. A process as set forth in claim 9, wherein said modifying step includes supplying ammonium hydrogensulfide to said copper film under vacuum condition with heating at a temperature of 200° C.

11. A process as set forth in claim 9, wherein said modifying step includes supplying a gas mixture containing hydrogen and hydrogen sulfide to said copper film under ordinary pressure balanced to that of an ambient atmosphere with heating at a temperature of 200° C.

12. A process as set forth in claim 11, wherein the contained ratio of said hydrogen to said hydrogen sulfide is adjusted to 1:1.

13. A process as set forth in claim 9, wherein said reducing step includes subjecting said copper film on which said copper sulfide is laid to an atmosphere containing ammonia gas with heating at a temperature of 250° C.

14. A process as set forth in claim 9, wherein said reducing step includes subjecting said copper film on which said copper sulfide is layer to a mixture containing ammonium hydroxide and hydrogen peroxide, and boiling said film at a temperature of 80° C.

15. A process as set forth in claim 14, wherein the contained ratio of said ammonium hydroxide to said hydrogen peroxide is adjusted in a range from 2:1 to 2.95:0.05.

* * * * *